(12) United States Patent
Deng (10) Patent No.: US 12,159,920 B2
(45) Date of Patent: Dec. 3, 2024

(54) SEMICONDUCTOR STRUCTURE AND FABRICATION METHOD THEREOF

(71) Applicants: Semiconductor Manufacturing International (Shanghai) Corporation, Shanghai (CN); Semiconductor Manufacturing International (Beijing) Corporation, Beijing (CN)

(72) Inventor: Wufeng Deng, Shanghai (CN)

(73) Assignees: Semiconductor Manufacturing International (Shanghai) Corporation, Shanghai (CN); Semiconductor Manufacturing International (Beijing) Corporation, Beijing (CN)

( * ) Notice: Subject to any disclaimer, the term of this patent is extended or adjusted under 35 U.S.C. 154(b) by 396 days.

(21) Appl. No.: 17/645,893

(22) Filed: Dec. 23, 2021

(65) Prior Publication Data

US 2022/0208987 A1    Jun. 30, 2022

(30) Foreign Application Priority Data

Dec. 24, 2020 (CN) .......................... 202011553818.8

(51) Int. Cl.
*H01L 29/66* (2006.01)
*H01L 29/40* (2006.01)

(52) U.S. Cl.
CPC ........ *H01L 29/6656* (2013.01); *H01L 29/401* (2013.01); *H01L 29/6653* (2013.01); *H01L 29/66545* (2013.01)

(58) Field of Classification Search
CPC ............... H01L 29/6656; H01L 29/401; H01L 29/6653; H01L 29/66545; H01L 29/66636; H01L 29/4991; H01L 29/66803; H01L 29/42356; H01L 29/785
See application file for complete search history.

(56) References Cited

U.S. PATENT DOCUMENTS

| | | | |
|---|---|---|---|
| 9,716,158 B1 * | 7/2017 | Cheng | H01L 21/823821 |
| 9,954,058 B1 * | 4/2018 | Mochizuki | H01L 29/42392 |
| 10,727,297 B2 * | 7/2020 | Wang | H01L 29/6653 |
| 11,984,489 B2 * | 5/2024 | Liu | H01L 29/6653 |
| 12,027,581 B2 * | 7/2024 | Singh | H01L 29/66825 |
| 2015/0228754 A1 * | 8/2015 | Sung | H01L 21/76224 438/595 |
| 2021/0098592 A1 * | 4/2021 | Kang | H01L 29/66545 |

(Continued)

*Primary Examiner* — Victor A Mandala
(74) *Attorney, Agent, or Firm* — Anova Law Group, PLLC (57) ABSTRACT

A semiconductor structure and a fabrication method of the semiconductor structure are provided. The semiconductor structure includes a substrate, a gate structure over the substrate, and a sidewall spacer structure located on a sidewall surface of the gate structure. The sidewall spacer structure includes a first sidewall spacer, a second sidewall spacer, and a cavity located between the first sidewall spacer and the second sidewall spacer. The first sidewall spacer is located on the sidewall surface of the gate structure. A top surface of the cavity is above a top surface of the gate structure, and a bottom surface of the cavity is coplanar with a bottom surface of the gate structure. The semiconductor structure also includes a source and drain plug located over the substrate on each side of the gate structure. The source and drain plug is located on a sidewall surface of the second sidewall spacer.

20 Claims, 7 Drawing Sheets

(56) References Cited

U.S. PATENT DOCUMENTS

| | | | | |
|---|---|---|---|---|
| 2021/0249519 A1* | 8/2021 | Yao | .................. | H01L 29/66795 |
| 2022/0310826 A1* | 9/2022 | Chiang | ............... | H01L 29/7851 |
| 2022/0359708 A1* | 11/2022 | Yao | .................. | H01L 29/66545 |
| 2023/0154921 A1* | 5/2023 | Huang | ................ | H01L 29/6653 |
| | | | | 257/401 |
| 2024/0250151 A1* | 7/2024 | Chang | ................ | H01L 29/0649 |

* cited by examiner

SEMICONDUCTOR STRUCTURE AND FABRICATION METHOD THEREOF

CROSS-REFERENCES TO RELATED APPLICATIONS

This application claims the priority of Chinese patent application No. 202011553818.8, filed on Dec. 24, 2020, the entirety of which is incorporated herein by reference.

FIELD OF THE DISCLOSURE

The present disclosure generally relates to the field of semiconductor manufacturing technology and, more particularly, relates to a semiconductor structure and a fabrication method thereof.

BACKGROUND

With the continuous development of semiconductor manufacturing technology, the improvement of integrated circuit performance is mainly achieved by continuously reducing the size of integrated circuit devices to increase the speed of the integrated circuit. At present, due to the demands for high device density, high performance and low cost, the semiconductor industry has advanced to the nano-technology process node, and the fabrication of semiconductor devices is restricted by various physical limits.

As the size of CMOS device continues to shrink, challenges from manufacturing and design have prompted the development of three-dimensional design such as a fin field effect transistor (FinFET). Compared with a conventional planar transistor, the FinFET is an advanced semiconductor device used at 20 nm and below process nodes. The FinFET is capable of effectively controlling the short-channel effect that is caused by the scaling down of the device and is insurmountable in the planar transistor, and is also capable of effectively improving the density of transistor array formed on the substrate. At the same time, a gate of the FinFET is configured surrounding the fin (fin-shaped channel), such that the electrostatic control may be performed from three sides, and the performance in electrostatic control may be substantially prominent.

However, the performance of conventional FinFET still needs to be improved. The disclosed methods and semiconductor structures are directed to solve one or more problems set forth above and other problems.

BRIEF SUMMARY OF THE DISCLOSURE

One aspect of the present disclosure provides a semiconductor structure. The semiconductor structure includes a substrate, a gate structure over the substrate, and a sidewall spacer structure located on a sidewall surface of the gate structure. The sidewall spacer structure includes a first sidewall spacer, a second sidewall spacer, and a cavity located between the first sidewall spacer and the second sidewall spacer. The first sidewall spacer is located on the sidewall surface of the gate structure. A top surface of the cavity is above a top surface of the gate structure, and a bottom surface of the cavity is coplanar with a bottom surface of the gate structure. The semiconductor structure also includes a source and drain plug located over the substrate on each side of the gate structure. The source and drain plug is located on a sidewall surface of the second sidewall spacer.

Another aspect of the present disclosure provides a fabrication method of a semiconductor structure. The method includes forming a dummy gate structure over a substrate, and forming a sidewall spacer structure on a sidewall surface of the dummy gate structure. The sidewall spacer structure includes a first sidewall spacer, a second sidewall spacer, and a sacrificial sidewall spacer located between the first sidewall spacer and the second sidewall spacer, and the first sidewall spacer is located on the sidewall surface of the dummy gate structure. The method also includes forming a first dielectric layer over the substrate. The first dielectric layer is located on a sidewall surface of the sidewall spacer structure. Moreover, the method includes after forming the sidewall spacer structure, removing the dummy gate structure to form a dummy gate opening in the first dielectric layer. In addition, the method includes forming a gate structure in the dummy gate opening, forming a plug opening in the first dielectric layer, and forming a source and drain plug in the plug opening. The plug opening exposes a sidewall surface of the second sidewall spacer. Further, the method includes after forming the source and drain plug, removing the sacrificial sidewall spacer to form a cavity between the first sidewall spacer and the second sidewall spacer.

Optionally, forming the sidewall spacer structure includes: forming a first sidewall spacer material layer on a top surface and the sidewall surface of the dummy gate structure and on a surface of the substrate; forming a sacrificial material layer on a sidewall surface of the first sidewall spacer material layer; forming a second sidewall spacer material layer on a surface of the sacrificial material layer and on an exposed surface of the first sidewall spacer material layer; and back-etching the first sidewall spacer material layer, the sacrificial material layer, and the second sidewall spacer material layer until a top surface of the dummy gate structure is exposed, to form the first sidewall spacer from the first sidewall spacer material layer, form the sacrificial sidewall spacer from the sacrificial material layer, and form the second sidewall spacer from the second sidewall spacer material layer.

Optionally, forming the sacrificial material layer includes: forming an initial sacrificial material film on a surface of the first sidewall spacer material layer; and back-etching the initial sacrificial material film until a top surface of the first sidewall spacer material layer is exposed, to form the sacrificial material layer.

Optionally, after forming the second sidewall spacer material layer, and before back-etching the first sidewall spacer material layer, the sacrificial material layer, and the second sidewall spacer material layer, the method further includes forming a sacrificial structure over the substrate. The sacrificial structure covers a partial surface of the second sidewall spacer material layer over the substrate and exposes another partial surface of the second sidewall spacer material layer over a top of the dummy gate structure. During the process of back-etching the first sidewall spacer material layer, the sacrificial material layer, and the second sidewall spacer material layer, the second sidewall spacer material layer and the first sidewall spacer material layer over the top of the dummy gate structure are removed, and the first sidewall spacer material layer and the second sidewall spacer material layer over the substrate are retained.

Optionally, the first sidewall spacer is made of a material different from the sacrificial sidewall spacer, and the second sidewall spacer is made of a material different from the sacrificial sidewall spacer.

Optionally, the first sidewall spacer is made of a material including silicon oxide, silicon nitride, silicon oxy-nitride, or titanium dioxide; the second sidewall spacer is made of a material including silicon oxide, silicon nitride, silicon oxy-nitride, or titanium dioxide; and the sacrificial sidewall spacer is made of a material including silicon oxide, silicon nitride, silicon oxy-nitride, or titanium dioxide.

Optionally, after forming the first sidewall spacer material layer, and before forming the sacrificial material layer, the method further includes forming a source and drain doped region in the substrate on each side of the dummy gate structure.

Optionally, forming the source and drain doped region includes: removing the substrate on each side of the dummy gate structure to form a source and drain opening in the substrate; and forming the source and drain doped region in the source and drain opening.

Optionally, forming the source and drain doped region in the source and drain opening includes: forming an epitaxial layer in the source and drain opening using an epitaxial growth process; and while forming the epitaxial layer, adding source and drain doped ions into the epitaxial layer using an in-situ doping process, to form the source and drain doped region.

Optionally, a top surface of the source and drain plug is above a top surface of the gate structure.

Optionally, after forming the gate structure and before removing the sacrificial sidewall spacer, the method further includes: forming a second dielectric layer on a surface of the first dielectric layer and on the top surface of the gate structure; and forming the plug opening in the first dielectric layer and the second dielectric layer.

Optionally, forming the plug opening includes: forming a patterned layer on a surface of the second dielectric layer, where the patterned layer exposes a partial surface of the second dielectric layer over the source and drain doped region; and etching the first dielectric layer and the second dielectric layer using the patterned layer as a mask until a surface of the source and drain doped region is exposed, to form the plug opening in the first dielectric layer and the second dielectric layer.

Optionally, forming the source and drain plug includes: forming a source and drain plug material layer in the plug opening and on a surface of the second dielectric layer; and planarizing the source and drain plug material layer until the surface of the second dielectric layer is exposed, to form the source and drain plug in the plug opening.

Optionally, after forming the cavity, the method further includes forming a third dielectric layer over the gate structure, where the third dielectric layer seals a top of the cavity.

Optionally, forming the third dielectric layer includes: forming a lower dielectric layer on a top surface of the gate structure, a top surface of the first sidewall spacer, a top surface of the second sidewall spacer, and a top surface and a portion of a sidewall surface of the source and drain plug, where the lower dielectric layer seals the top of the cavity; and forming an upper dielectric layer on a surface of the lower dielectric layer, where a top surface of the upper dielectric layer is above a top surface of the source and drain plug.

Optionally, forming the lower dielectric layer includes a chemical vapor deposition process. The chemical vapor deposition process includes a plasma-enhanced chemical vapor deposition process, a high-concentration plasma deposition process, or a high depth-to-width ratio deposition process.

Optionally, along a direction perpendicular to a sidewall of the cavity, a size of the cavity is in a range of approximately 5 nm-10 nm.

Optionally, forming the gate structure in the dummy gate opening includes: forming an interface layer on a bottom surface of the dummy gate opening; forming a high-K dielectric material film over a bottom and on a sidewall surface of the dummy gate opening, and on a surface of the first dielectric layer, where the high-K dielectric material film is located on a surface of the interface layer; forming a work function material film on a surface of the high-K dielectric material film; forming a gate material film on a surface of the work function material film; and planarizing the high-K dielectric material film, the work function material film, and the gate material film until the surface of the first dielectric layer is exposed, to form a high-K dielectric layer from the high-K dielectric material film, form a work function layer from the work function material film, and form a gate layer from the gate material film.

Optionally, the substrate includes a base, and a fin and an isolation layer over the base, where the isolation layer covers a portion of a sidewall surface of the fin. The dummy gate structure is located on a surface of the isolation layer, and is across a length portion of the fin.

The disclosed embodiments may have following beneficial effects. In the disclosed semiconductor structure of the present disclosure, the sidewall spacer structure may be located on the sidewall surface of the gate structure. The sidewall spacer structure may include the first sidewall spacer, the second sidewall spacer, and the cavity located between the first sidewall spacer and the second sidewall spacer. Therefore, the gate structure may have desired performance. At the same time, because the cavity has an opening structure, air may fill the cavity. The dielectric constant of the cavity may be substantially small, which may facilitate to reduce the parasitic capacitance between the gate structure and any other device, thereby facilitating to improve the performance of the semiconductor structure.

In the disclosed fabrication method of the semiconductor structure of the present disclosure, after replacing the dummy gate structure with the gate structure, the sacrificial sidewall spacer on the sidewall surface of the first sidewall spacer may be removed, to form the cavity between the first sidewall spacer and the second sidewall spacer. Because the first sidewall spacer is formed on the sidewall surface of the gate structure, the first sidewall spacer may protect the gate structure, and may prevent the sidewall of the gate structure from being damaged in subsequent processes, such that the gate structure may have desired performance. At the same time, the cavity may be formed between the first sidewall spacer and the second sidewall spacer, and the first sidewall spacer may be located on the sidewall surface of the gate structure. Because the cavity has an opening structure, air may fill the cavity. The dielectric constant of the cavity may be substantially small, which may facilitate to reduce the parasitic capacitance between the gate structure and any other device, thereby facilitating to improve the performance of the semiconductor structure.

In addition, the plug opening may expose the sidewall surface of the second sidewall spacer, and the source and drain plug located in the plug opening may be located on the sidewall surface of the second sidewall spacer. Therefore, the second sidewall spacer may protect the source and drain plug, and may prevent the sidewall of the source and drain plug from being damaged in subsequent processes, such that the source and drain plug may have desired performance.

Further, during the process of back-etching the first sidewall spacer material layer, the sacrificial material layer, and the second sidewall spacer material layer, the sacrificial structure may make the first sidewall spacer material layer and the second sidewall spacer material layer over the substrate be retained. Therefore, when forming the plug opening by etching, the first sidewall spacer material layer and the second sidewall spacer material layer over the substrate may be configured as a stop layer of the etching process, such that the formed plug opening may have desired morphology, and the damage on the source and drain doped region may be substantially small, thereby improving the performance of the formed semiconductor structure.

Other aspects of the present disclosure can be understood by those skilled in the art in light of the description, the claims, and the drawings of the present disclosure.

DETAILED DESCRIPTION

Reference will now be made in detail to exemplary embodiments of the disclosure, which are illustrated in the accompanying drawings. Wherever possible, the same reference numbers will be used throughout the drawings to refer to the same or the alike parts.

It should be noted that the terms such as "surface" and "on" in the present disclosure are used to describe a relative positional relationship in space, and are not limited to direct contact.

Figure 1:
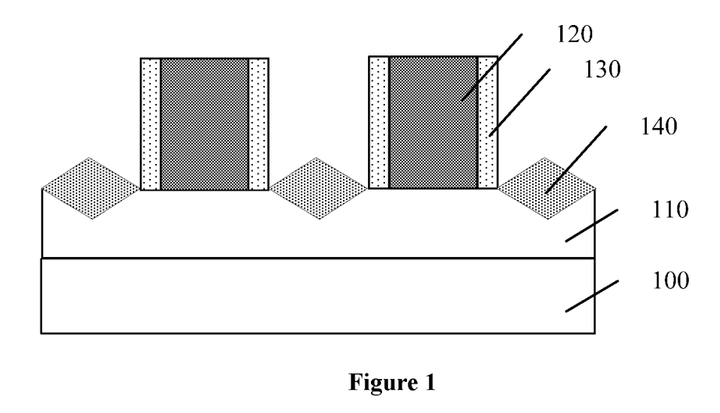
FIGS. 1-4 illustrate semiconductor structures corresponding to certain stages for forming a semiconductor structure.

The performance of the conventional semiconductor structure is substantially poor. FIGS. 1-4 illustrate semiconductor structures corresponding to certain stages for forming a semiconductor structure. Referring to FIG. 1, a substrate 100 is provided, and a fin 110 and a dummy gate structure 120 are formed on the substrate. The dummy gate structure 120 is across a length portion of the fin 110, and covers a portion of a top surface and a portion of a sidewall surface of the fin 110. A sidewall spacer 130 is formed on the sidewall surface of the dummy gate structure 120. Source and drain doped regions 140 are formed in the fin 110 on both sides of the dummy gate structure 120 and the sidewall spacer 130.

Figure 2:
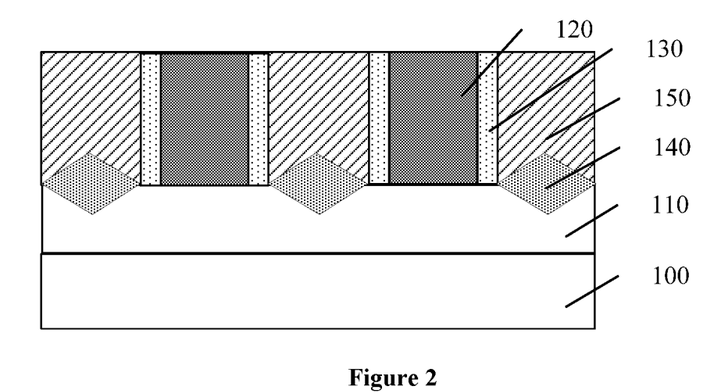

Referring to FIG. 2, a first dielectric layer 150 is formed over the substrate 100, and the first dielectric layer 150 covers a sidewall surface of the sidewall spacer 130.

Figure 3:
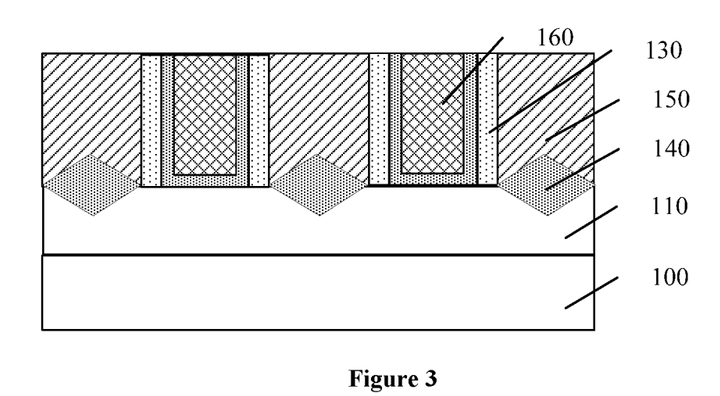

Referring to FIG. 3, the dummy gate structure 120 is removed, to form a dummy gate opening (not illustrated in the Figure) in the first dielectric layer 150. A gate structure 160 is formed in the dummy gate opening.

Figure 4:
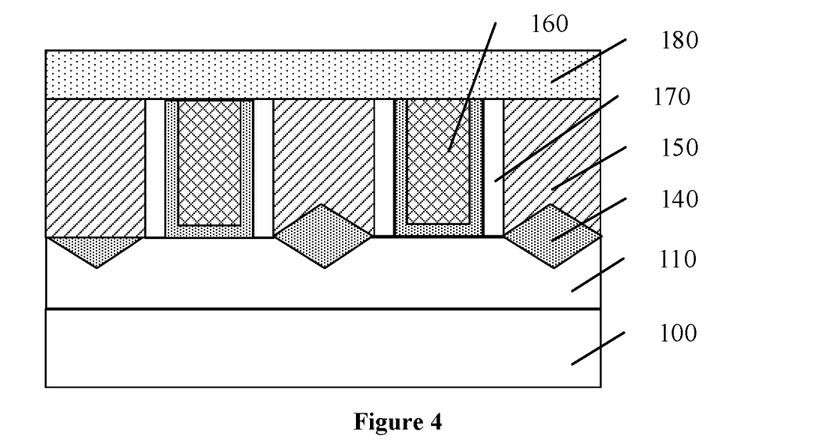

Referring to FIG. 4, after the gate structure 160 is formed, the sidewall spacer 130 is removed to form a cavity 170 in the first dielectric layer 150. A second dielectric layer 180 is formed on the surface of the first dielectric layer 150. The second dielectric layer 180 is located on the top of the cavity 170 and seals the top of the cavity 170.

In the above method, the cavity 170 is formed in the first dielectric layer 150 by removing the sidewall spacer 130. Specifically, the cavity 170 has a hole-structure, and air fills the cavity 170. With respect to the material of the sidewall spacer 130, the dielectric constant of air is smaller. The method of configuring the cavity 170 on the sidewall of the gate structure 160 facilitates to reduce the capacitance between the gate structure 160 and any other device, thereby improving the performance of the formed semiconductor structure.

However, in the process of removing the sidewall spacer 130 to form the cavity 170, the sidewall of the gate structure 160 is exposed, and tends to be subjected to damages caused by the etching process, which causes a decrease in the performance of the gate structure 170, such that the performance of the semiconductor structure is substantially poor.

The present disclosure provides a semiconductor structure and a fabrication method of the semiconductor structure. The method may include forming a sidewall spacer structure on a sidewall surface of a dummy gate structure. The sidewall spacer structure may include a first sidewall spacer, a second sidewall spacer, and a sacrificial sidewall spacer located between the first sidewall spacer and the second sidewall spacer. The first sidewall spacer may be located on the sidewall surface of the dummy gate structure. The method may also include after forming the gate structure by replacing the dummy gate structure, removing the sacrificial sidewall spacer to form a cavity between the first sidewall spacer and the second sidewall spacer. The first sidewall spacer may protect the gate structure, and may reduce the damages on the sidewall of the gate structure in subsequent processes. At the same time, the dielectric constant of the cavity between the first sidewall spacer and the second sidewall spacer may be substantially small, which may facilitate to reduce the parasitic capacitance between the gate structure and any other device, and may facilitate to improve the performance of the semiconductor structure.

Figure 15:
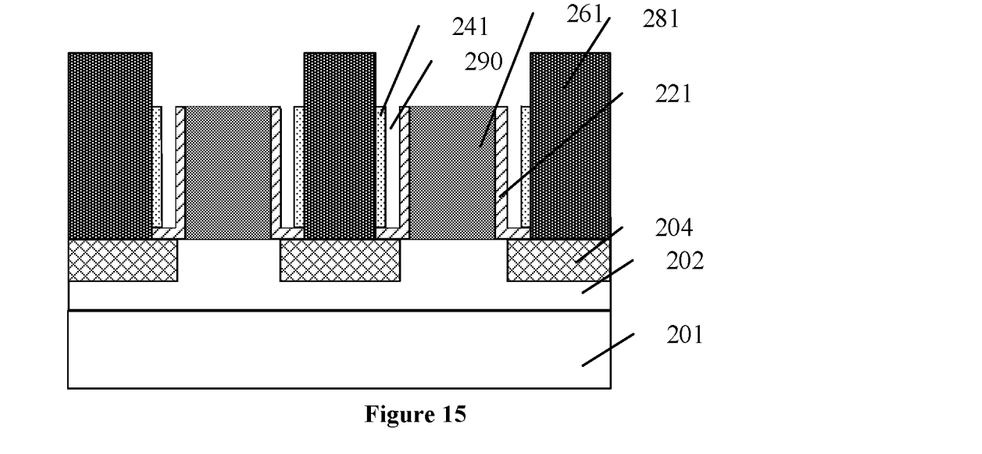
Figure 16:
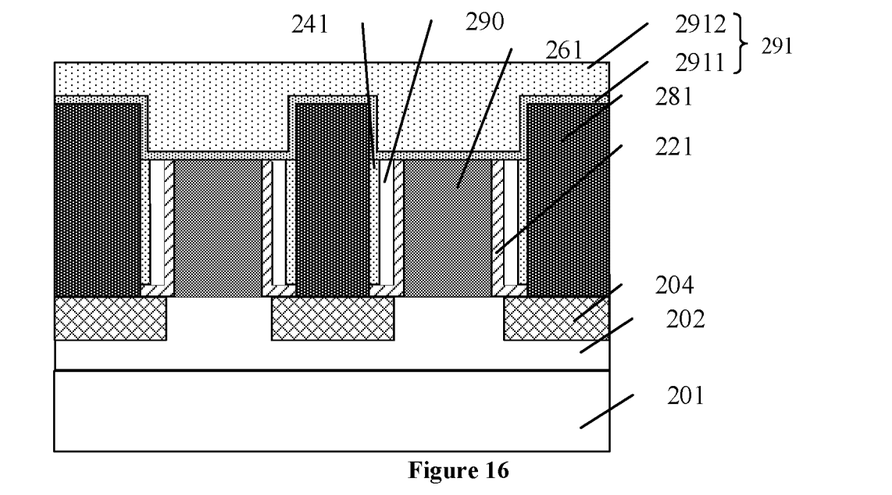
Figure 17:
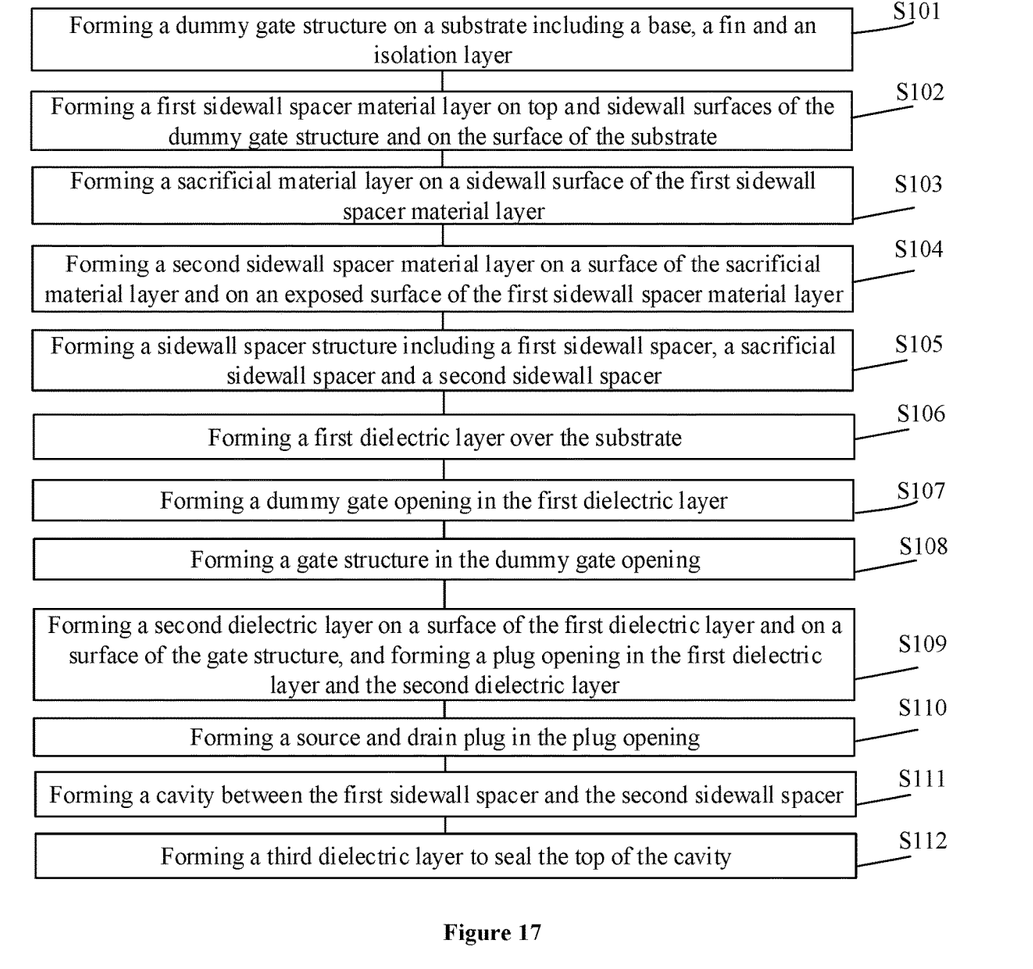
FIG. 17 illustrates a schematic flowchart of an exemplary fabrication method of a semiconductor structure consistent with various disclosed embodiments of the present disclosure.

The present disclosure provides a fabrication method of a semiconductor structure. FIG. 17 illustrates a flowchart of a method for forming a semiconductor structure consistent with various disclosed embodiments of the present disclosure, and FIGS. 5-16 illustrate semiconductor structures corresponding to certain stages of the fabrication method.

Figure 5:
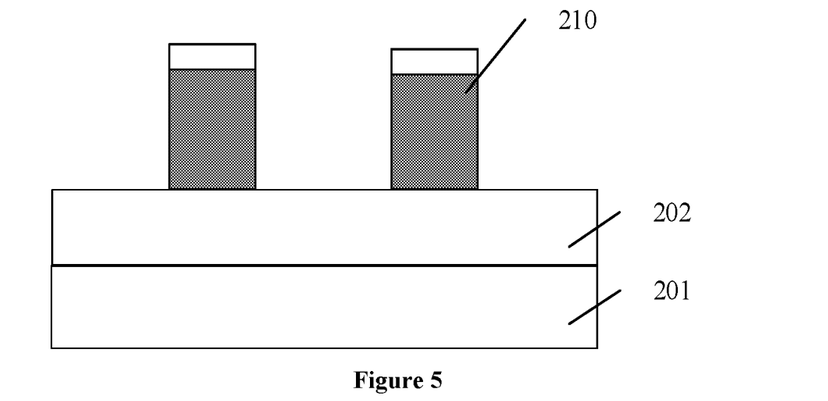
FIGS. 5-16 illustrate semiconductor structures corresponding to certain stages for forming an exemplary semiconductor structure consistent with various disclosed embodiments of the present disclosure.

As shown in FIG. 17, at the beginning of the fabrication method, a dummy gate structure may be formed on a substrate (S101). FIG. 5 illustrates a corresponding semiconductor structure.

Referring to FIG. 5, a substrate may be provided, and a dummy gate structure 210 may be formed over the substrate. In one embodiment, the substrate may include a base 201, a fin 202 and an isolation layer (not illustrated in the Figure) over the base 201. The isolation layer may cover a portion of a sidewall surface of the fin 202.

In one embodiment, the base 201 may be made of silicon. In another embodiment, the base may be made of germanium, silicon germanium, silicon carbide, gallium arsenide or indium gallium.

In one embodiment, the fin 202 may be made of silicon. In another embodiment, the fin may be made of germanium, silicon germanium, silicon carbide, gallium arsenide or indium gallium.

In one embodiment, the dummy gate structure 210 may be located on the surface of the isolation layer, and may be across a length portion of the fin 202. The isolation layer may electrically isolate adjacent fins 202.

In one embodiment, the isolation layer may be made of silicon oxide. In another embodiment, the isolation layer may be made of silicon nitride or silicon oxy-nitride.

In another embodiment, the substrate may be a planar base.

In one embodiment, a hard mask structure may be formed on the top surface of the dummy gate structure 210. On the one hand, the hard mask structure may be configured to protect the top surface of the dummy gate structure 210, to reduce the influence on the top surface of the dummy gate structure 210. On the other hand, the hard mask structure may be configured to serve as a stop layer for subsequent etching.

In one embodiment, the hard mask structure may include a first hard mask layer (not illustrated in the Figure) on the top surface of the dummy gate structure 210; and a second hard mask layer on the surface of the first hard mask layer (not illustrated in the Figure). In certain embodiments, the hard mask structure may have a single-layer structure.

Then, a sidewall spacer structure may be formed on a sidewall surface of the dummy gate structure 210. The sidewall spacer structure may include a first sidewall spacer, a second sidewall spacer, and a sacrifice sidewall spacer located between the first sidewall spacer and the second sidewall spacer. The first sidewall spacer may be located on the sidewall surface of the dummy gate structure 210. The specific process of forming the sidewall spacer structure may refer to FIGS. 6-9.

Figure 6:
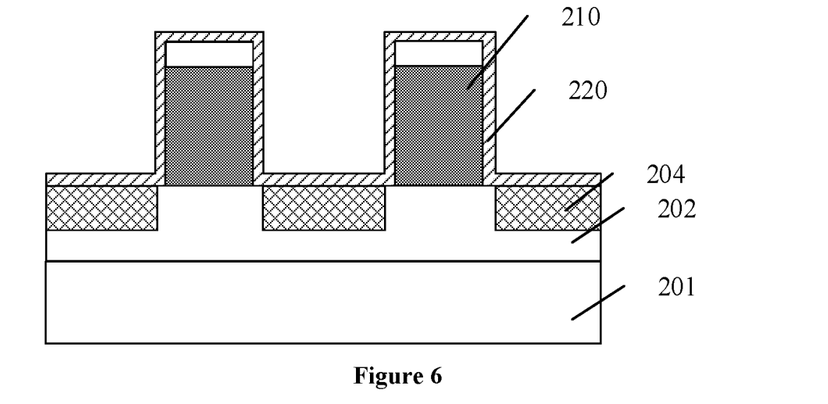

Returning to FIG. 17, after forming the dummy gate structure, a first sidewall spacer material layer may be formed (S102). FIG. 6 illustrates a corresponding semiconductor structure.

Referring to FIG. 6, a first sidewall spacer material layer 220 may be formed on top and sidewall surfaces of the dummy gate structure 210 and on the surface of the substrate. The first sidewall spacer material layer 220 may provide a material layer for subsequently forming a first sidewall spacer.

The first sidewall spacer material layer 220 may be made of a material including silicon oxide, silicon nitride, silicon oxy-nitride, or titanium dioxide. In one embodiment, the first sidewall spacer material layer 220 may be made of silicon nitride.

In one embodiment, the method for forming the semiconductor structure may further include after forming the first sidewall spacer material layer 220 and before subsequently forming a sacrificial material layer, forming source and drain doped regions 204 in the substrate on both sides of the dummy gate structure 210. In one embodiment, the source and drain doped regions 204 may be located in the fin 202 on both sides of the dummy gate structure 210.

It should be noted that in the process of forming the source and drain doped regions 204, the first sidewall spacer material layer 220 located on the surface of the substrate on both sides of the dummy gate structure 210 and on the top surface of the dummy gate structure 210 may be removed. After forming the source and drain doped regions 204, a supplementary sidewall spacer material layer may be formed on the surfaces of the source and drain doped regions 204 and on the top surface of the dummy gate structure 210. The supplementary sidewall spacer material layer and the first sidewall spacer material layer located on the sidewall of the dummy gate structure 210 may together serve as the first sidewall spacer material layer 220 in subsequent process.

Forming the source and drain doped regions 204 may include: removing the substrate on both sides of the dummy gate structure 210 to form source and drain openings (not illustrated in the Figure) in the substrate; and forming the source and drain doped regions 204 in the source and drain openings.

Forming the source and drain doped regions 204 in the source and drain openings may include: forming an epitaxial layer (not illustrated in the Figure) in each source and drain opening using an epitaxial growth process; and while forming the epitaxial layer, adding source and drain doped ions into the epitaxial layer (not illustrated in the Figure) using an in-situ doping process to form the source and drain doped region 204.

Figure 7:
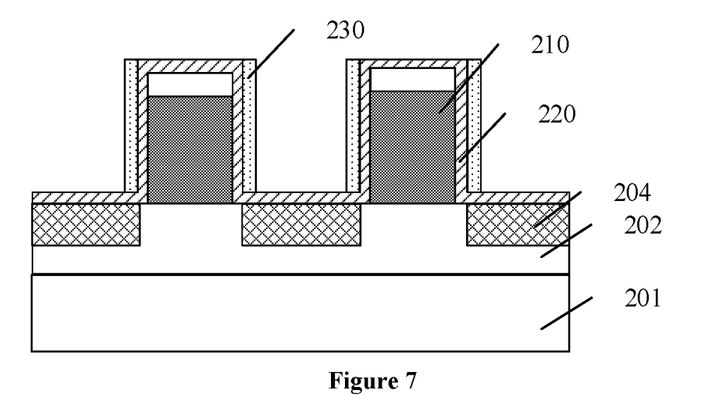

Returning to FIG. 17, after forming the source and drain doped regions, a sacrificial material layer may be formed (S103). FIG. 7 illustrates a corresponding semiconductor structure.

Referring to FIG. 7, a sacrificial material layer 230 may be formed on a sidewall surface of the first sidewall spacer material layer 220. In one embodiment, the sacrificial material layer 230 may provide a material layer for subsequently forming a sacrificial sidewall spacer.

The sacrificial material layer 230 may be made of a material different from the first sidewall spacer material layer 220. The sacrificial material layer 230 may be made of a material including silicon oxide, silicon nitride, silicon oxy-nitride, or titanium dioxide. In one embodiment, the sacrificial material layer 230 may be made of silicon oxide.

Forming the sacrificial material layer 230 may include forming an initial sacrificial material film (not illustrated in the Figure) on the surface of the first sidewall spacer material layer 220; and back-etching the initial sacrificial material film until the top surface of the first sidewall spacer material layer 220 is exposed, to form the sacrificial material layer 230.

Figure 8:
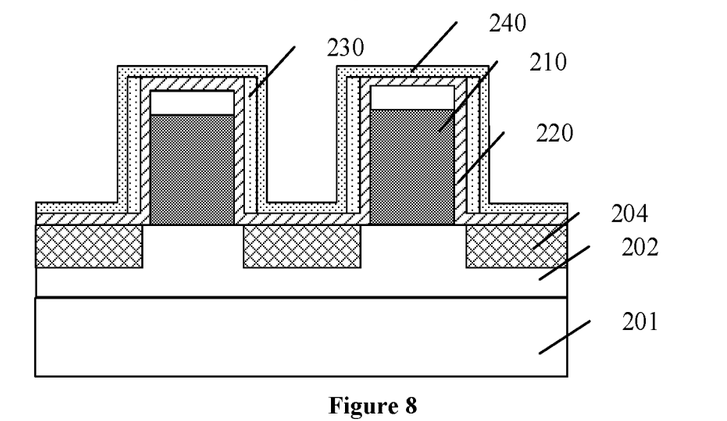

Returning to FIG. 17, after forming the sacrificial material layer, a second sidewall spacer material layer may be formed (S104). FIG. 8 illustrates a corresponding semiconductor structure.

Referring to FIG. 8, a second sidewall spacer material layer 240 may be formed on the surface of the sacrificial material layer 230 and on the exposed surface of the first sidewall spacer material layer 220. The second sidewall spacer material layer 240 may provide a material layer for subsequently forming the second sidewall spacer.

The second sidewall spacer material layer 240 may be made of a material different from the sacrificial material layer 230. The second sidewall spacer material layer 240 may be made of a material including silicon oxide, silicon nitride, silicon oxy-nitride, or titanium dioxide. In one embodiment, the second sidewall spacer material layer 240 may be made of silicon nitride.

Figure 9:
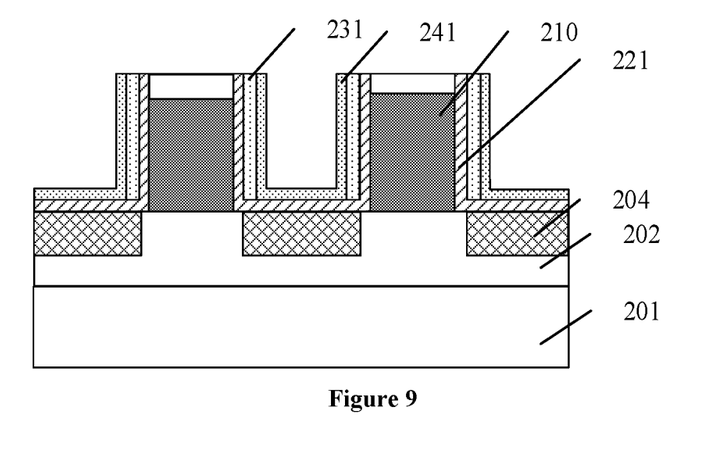

Returning to FIG. 17, after forming the second sidewall spacer material layer, a first sidewall spacer, a sacrificial sidewall spacer and a second sidewall spacer may be formed (S105). FIG. 9 illustrates a corresponding semiconductor structure.

Referring to FIG. 9, the first sidewall spacer material layer 220, the sacrificial material layer 230, and the second sidewall spacer material layer 240 may be back-etched until the top surface of the dummy gate structure 210 is exposed, such that the first sidewall spacer material layer 220 may form a first sidewall spacer 221, the sacrificial material layer 230 may form a sacrificial sidewall spacer 231, and the second sidewall spacer material layer 240 may form a second sidewall spacer 241.

The first sidewall spacer 221, the second sidewall spacer 241, and the sacrificial sidewall spacer 231 located between the first sidewall spacer 221 and the second sidewall spacer 241 may form a sidewall spacer structure (not illustrated in the Figure). The sidewall spacer structure may be located on sidewall surface of the dummy gate structure 210. The sacrificial sidewall spacer 231 may occupy the space for the subsequent formation of a cavity.

In one embodiment, the hard mask structure may be formed on the top surface of the dummy gate structure 210. The first sidewall spacer material layer 220, the sacrificial material layer 230, and the second sidewall spacer material layer 240 may be back-etched until the surface of the hard mask structure is exposed.

The first sidewall spacer material layer 220 may form the first sidewall spacer 221, the sacrificial material layer 230 may form the sacrificial sidewall spacer 231, and the second sidewall spacer material layer 240 may form the second sidewall spacer 241. Accordingly, the first sidewall spacer 221 may be made of a material different from the sacrificial sidewall spacer 231, and the second sidewall spacer 241 may be made of a material different from the sacrificial sidewall spacer 231. The first sidewall spacer 221 may be made of a material including silicon oxide, silicon nitride, silicon oxynitride, or titanium dioxide. The second sidewall spacer 241 may be made of a material including silicon oxide, silicon nitride, silicon oxy-nitride or titanium dioxide. The sacrificial sidewall spacer 231 may be made of a material including silicon oxide, silicon nitride, silicon oxy-nitride or titanium dioxide.

In one embodiment, the method for forming the semiconductor structure may further include: after forming the second sidewall spacer material layer 240, and before back-etching the first sidewall spacer material layer 220, the sacrificial material layer 230, and the second sidewall spacer material layer 240, forming a sacrificial structure (not illustrated in the Figure) over the substrate. The sacrificial structure may cover the surface of the second sidewall spacer material layer 240 over the substrate and may expose the top surface of the second sidewall spacer material layer 240 over the top of the dummy gate structure 210.

In one embodiment, because the sacrificial structure is formed, during the process of back-etching the first sidewall spacer material layer 220, the sacrificial material layer 230, and the second sidewall spacer material layer 240, the second sidewall spacer material layer 240 and the first sidewall spacer material layer 220 over the top of the dummy gate structure 210 may be removed, and the first sidewall spacer material layer 220 and the second sidewall spacer material layer 240 over the substrate may be retained. Therefore, the first sidewall spacer material layer 220 and the second sidewall spacer material layer 240 retained on the substrate may be configured as a stop layer for subsequently forming a source and drain plug.

Figure 10:
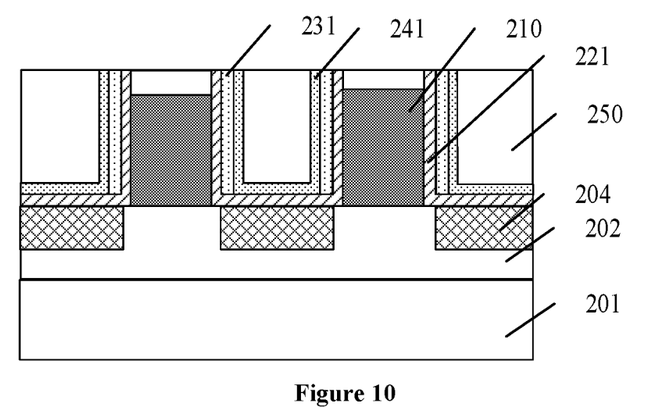

Returning to FIG. 17, after forming the sidewall spacer structure, a first dielectric layer may be formed (S106). FIG. 10 illustrates a corresponding semiconductor structure.

Referring to FIG. 10, a first dielectric layer 250 may be formed over the substrate, and the first dielectric layer 250 may be located on a sidewall surface of the sidewall spacer structure.

The first dielectric layer 250 may be made of a material different from the first sidewall spacer 221, and the first dielectric layer 250 may be made of a material different from the second sidewall spacer 241. In one embodiment, the first dielectric layer 250 may be made of a same material as the sacrificial sidewall spacer 231, and may be made of silicon oxide.

The method for forming the first dielectric layer 250 may include: forming a dielectric material layer (not illustrated in the Figure) covering the dummy gate structure 210 and the sidewall spacer structure over the substrate, where an entire surface of the dielectric material layer may be above the top surface of the dummy gate structure 210; and removing the dielectric material layer above the top surface of the dummy gate structure 210 to form the first dielectric layer 250.

In one embodiment, during the process of removing the dielectric material layer above the top surface of the dummy gate structure 210, the hard mask structure on the top surface of the dummy gate structure 210 and the sidewall spacer structure above the top surface of the dummy gate structure 210 may be removed. A top surface of the remaining sidewall spacer structure may be coplanar with the top surface of the dummy gate structure 210.

Figure 11:
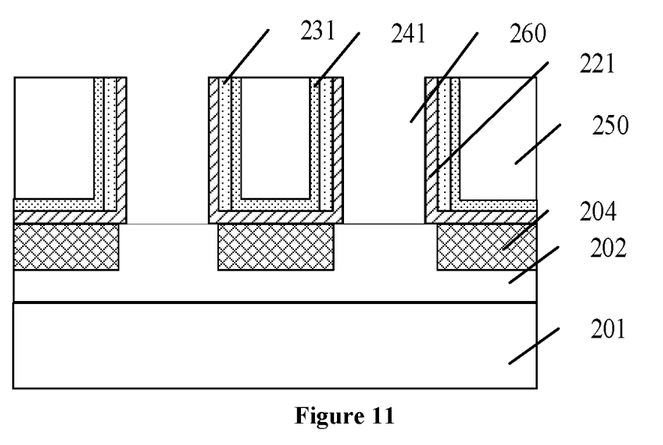

Returning to FIG. 17, after forming the first dielectric layer, a dummy gate opening may be formed (S107). FIG. 11 illustrates a corresponding semiconductor structure.

Referring to FIG. 11, after the sidewall spacer structure is formed, the dummy gate structure 210 may be removed to form a dummy gate opening 260 in the first dielectric layer 250.

Removing the dummy gate structure 210 may include one or more of a wet etching process and a dry etching process. In one embodiment, removing the dummy gate structure 210 may include a wet etching process, which may remove the dummy gate structure 210 rapidly, thereby improving production efficiency.

Figure 12:
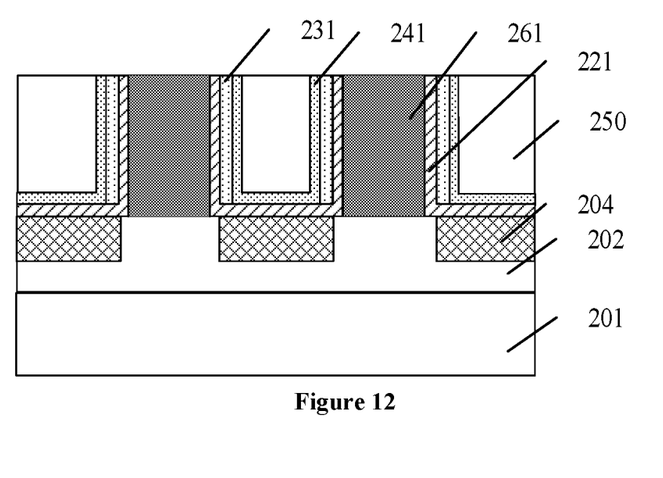

Returning to FIG. 17, after forming the dummy gate opening, a gate structure may be formed (S108). FIG. 12 illustrates a corresponding semiconductor structure.

Referring to FIG. 12, a gate structure 261 may be formed in the dummy gate opening 260.

Forming the gate structure 261 in the dummy gate opening 260 may include following. An interface layer (not illustrated in the Figure) may be formed on a bottom surface of the dummy gate opening 261. A high-K dielectric material film (not illustrated in the Figure) may be formed over the bottom and sidewall surfaces of the dummy gate opening 261 and on the surface of the first dielectric layer 250, where the high-K dielectric material film may be located over the surface of the interface layer. A work function material film (not illustrated in the Figure) may be formed on a surface of the high-K dielectric material film. A gate material film (not illustrated in the Figure) may be formed on a surface of the work function material film. The high-K dielectric material film, the work function material film, and the gate material film may be planarized until the surface of the first dielectric layer 250 is exposed. Therefore, the high-K dielectric material film may form a high-K dielectric layer (not illustrated in the Figure), the work function material film may form a work function layer (not illustrated in the Figure), and the gate material film may form a gate layer (not illustrated in the Figure). Thus, the gate structure 261 may be formed in the dummy gate opening 260.

The high-K dielectric layer may be made of a material including one or more of hafnium oxide, zirconium oxide, hafnium silicon oxide, lanthanum oxide, zirconium silicon oxide, titanium oxide, tantalum oxide, and aluminum oxide. In one embodiment, the high-K dielectric layer may be made of hafnium oxide.

The gate layer may be made of a material including a metal, and the metal may include one or more of copper, tungsten, aluminum, titanium, nickel, titanium nitride, and tantalum nitride. In one embodiment, the gate layer may be made of tungsten.

The work function layer may be made of a material including an N-type work function layer and a P-type work function layer. The interface layer may be made of a material including silicon dioxide. The interface layer may effectively reduce interface defects between the fin and the gate dielectric layer, thereby improving the interface state, which may facilitate to improve the performance of the formed semiconductor structure.

Figure 13:
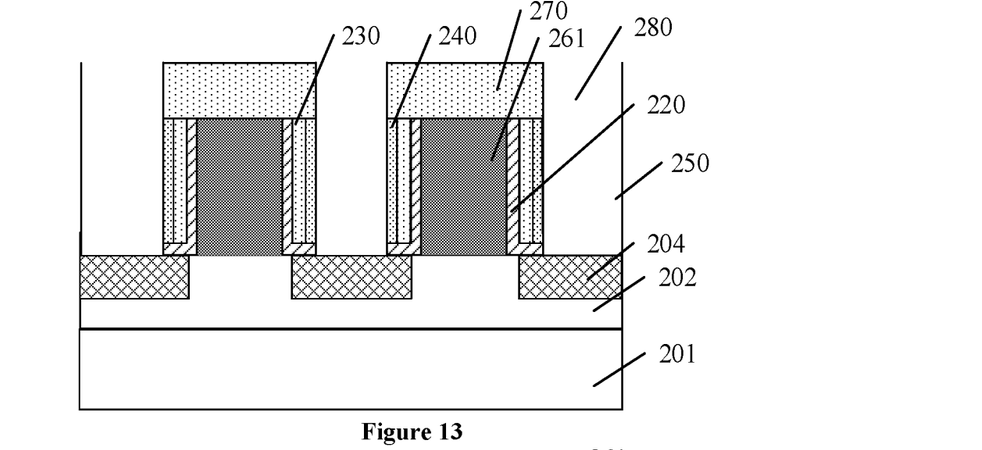
Figure 14:
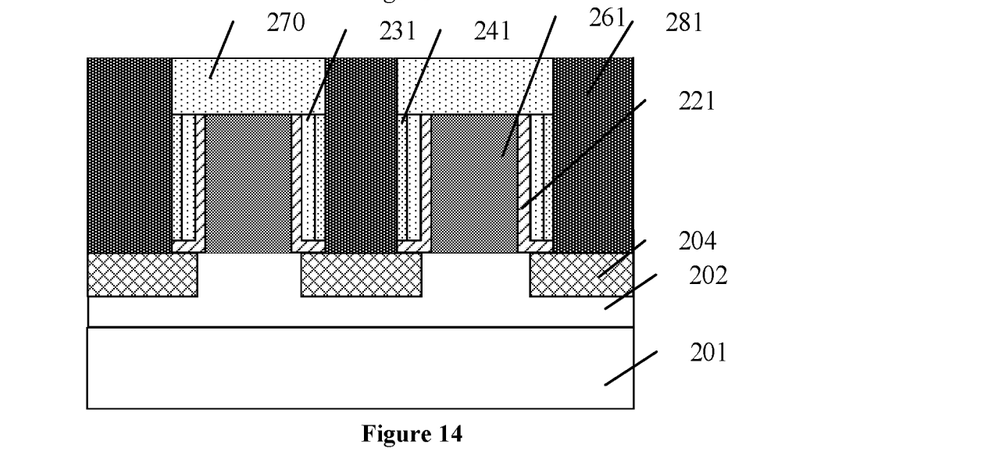

Then, a plug opening may be formed in the first dielectric layer 250, and a source and drain plug may be formed in the plug opening. The plug opening may expose the sidewall surface of the second sidewall spacer 241.

In one embodiment, a top surface of the source and drain plug may be above the top surface of the gate structure 261. The specific process of forming the plug opening and the source and drain plug may refer to FIG. 13 and FIG. 14.

Returning to FIG. 17, after forming the gate structure, a second dielectric layer and a plug opening may be formed (S109). FIG. 13 illustrates a corresponding semiconductor structure.

Referring to FIG. 13, a second dielectric layer 270 may be formed on the surface of the first dielectric layer 250 and on the surface of the gate structure 261. A plug opening 280 may be formed in the first dielectric layer 250 and the second dielectric layer 270.

In one embodiment, the plug opening 280 may not only expose the sidewall surface of the second sidewall spacer 241, but also expose the surface of the source and drain doped region 204.

The second dielectric layer 270 may be made of a material different from the first sidewall spacer 221, and the second dielectric layer 270 may be made of a material different from the second sidewall spacer 241. In one embodiment, the second dielectric layer 270 may be made of a same material as the sacrificial sidewall spacer 231, and may be made of silicon oxide.

Forming the plug opening 280 may include: forming a patterned layer (not illustrated in the Figure) on the surface of the second dielectric layer 270, where the patterned layer may expose the surface of the second dielectric layer 270 over the source and drain doped region 204; and etching the first dielectric layer 250 and the second dielectric layer 270 using the patterned layer as a mask until the surface of the source and drain doped region 204 is exposed, to form the plug opening 280 in the first dielectric layer 250 and the second dielectric layer 270.

In one embodiment, during the process of etching the first dielectric layer 250 and the second dielectric layer 270, a portion of the first sidewall spacer material layer 220 (shown in FIG. 9) and the second sidewall spacer material layer 240 (shown in FIG. 9) retained on the surface of the substrate may be etched until the surface of the source and drain doped region 204 is exposed.

During the process of back-etching the first sidewall spacer material layer, the sacrificial material layer, and the second sidewall spacer material layer, the sacrificial structure may make the first sidewall spacer material layer 220 and the second sidewall spacer material layer 240 over the substrate be retained. Therefore, when forming the plug opening 280 by etching, the first sidewall spacer material layer 220 and the second sidewall spacer material layer 240 over the substrate may be configured as a stop layer of the etching process, such that the formed plug opening 280 may have desired morphology, and the damages on the source and drain doped region 204 may be substantially small, thereby improving the performance of the formed semiconductor structure.

Returning to FIG. 17, after forming the plug opening, a source and drain plug may be formed in the plug opening (S110). FIG. 14 illustrates a corresponding semiconductor structure.

Referring to FIG. 14, a source and drain plug 281 may be formed in the plug opening 280. The source and drain plug 281 may be located on the surface of the source and drain doped region 204.

Forming the source and drain plug 281 may include: forming a source and drain plug material layer (not illustrated in the Figure) in the plug opening 280 and on the surface of the second dielectric layer 270; and planarizing the source and drain plug material layer until the surface of the second dielectric layer 270 is exposed, to form the source and drain plug in the plug opening 280.

Because the plug opening 280 exposes the sidewall surface of the second sidewall spacer 241, and the source and drain plug 281 located in the plug opening 280 are located on the sidewall surface of the second sidewall spacer 241, the second sidewall spacer 241 may protect the source and drain plug 281, and may prevent the sidewall of the source and drain plug 281 from being damaged in subsequent processes, such that the source and drain plug 281 may have desired performance.

In one embodiment, forming the source and drain plug material layer may include: forming a plug barrier material film on the bottom and sidewall surfaces of the plug opening 280 and on the surface of the second dielectric layer 270; and forming a plug conductive material film on the surface of the plug barrier material film, where the plug conductive material film may fill the plug opening.

The plug barrier material film may be configured to increase the adhesion between the plug conductive material film and the second dielectric layer 270 as well as the first dielectric layer 250.

Returning to FIG. 17, after forming the source and drain plug, a cavity may be formed between the first sidewall spacer and the second sidewall spacer (S111). FIG. 15 illustrates a corresponding semiconductor structure.

Referring to FIG. 15, after the source and drain plug 281 is formed, the sacrificial sidewall spacer 231 may be removed to form a cavity 290 between the first sidewall spacer 221 and the second sidewall spacer 241.

In one embodiment, before removing the sacrificial sidewall spacer 231, the second dielectric layer 270 may be removed to expose the sacrificial sidewall spacer 231. The sacrificial sidewall spacer 231 may be removed to form the cavity 290 between the first sidewall spacer 221 and the second sidewall spacer 241.

In one embodiment, the second dielectric layer 270 may be made of a same material as the sacrificial sidewall spacer 231. The second dielectric layer 270 and the sacrificial sidewall spacer 231 may be removed through a same etching process, thereby saving process steps and process duration.

After replacing the dummy gate structure 210 with the gate structure 261, the sacrificial sidewall spacer 231 on the sidewall surface of the first sidewall spacer 221 may be removed, to form the cavity 290 between the first sidewall spacer 221 and the second sidewall spacer 231. Because the first sidewall spacer 221 is located on the sidewall surface of the gate structure 261, the first sidewall spacer 221 may protect the gate structure 261, and may prevent the sidewall of the gate structure 261 from being damaged in subsequent processes, such that the gate structure 261 may have desired performance. At the same time, the cavity 290 may be formed between the first sidewall spacer 221 and the second sidewall spacer 241, and the first sidewall spacer 221 may be located on the sidewall surface of the gate structure 261. Because the cavity 290 has an opening structure, air may fill the cavity 290. The dielectric constant of the cavity 290 may be substantially small, which may facilitate to reduce the parasitic capacitance between the gate structure 261 and any other device, thereby facilitating to improve the performance of the semiconductor structure.

Along a direction perpendicular to the sidewall of the cavity 290, the size of the cavity 290 may be in a range of approximately 5 nm-10 nm. If the size is less than 5 nm, the cavity 290 with a small size may have a substantially weak isolation effect, and the parasitic capacitance between the gate structure 261 and any other device may not be effectively reduced. If the size is greater than 10 nm, it may be difficult for the subsequently formed third dielectric layer to seal the top of the cavity 290, and a portion of the material of the third dielectric layer may fill the cavity 290, which may cause the dielectric constant of the cavity 290 to be affected by the material of the third dielectric layer, and may not effectively reduce the parasitic capacitance between the gate structure 261 and any other device.

A depth of the cavity 290 may be in a range of approximately 10 nm-40 nm. The depth may refer to a dimension in a direction perpendicular to the surface of the substrate.

Returning to FIG. 17, after forming the cavity, a third dielectric layer may be formed to seal the top of the cavity (S112). FIG. 16 illustrates a corresponding semiconductor structure.

Referring to FIG. 16, after the cavity 290 is formed, a third dielectric layer 291 may be formed over the gate structure 261, and the third dielectric layer 291 may seal the top of the cavity 290.

Forming the third dielectric layer 291 may include: forming a lower dielectric layer 2911 on the top of the gate structure 261, the top of the first sidewall spacer 221, the top of the second sidewall spacer 241, and the top surface and a portion of the sidewall surface of the source and drain plug 281, where the lower dielectric layer 2911 may seal the top of the cavity 290; and forming an upper dielectric layer 2912 on a surface of the lower dielectric layer 2911.

In one embodiment, a top surface of the upper dielectric layer 2912 may be above the top surface of the source and drain plug 281.

Forming the lower dielectric layer 2911 may include a chemical vapor deposition process. The chemical vapor deposition process may include a plasma-enhanced chemical vapor deposition process (PECVD), a high-concentration plasma deposition process (HDP), or a high depth-to-width ratio deposition process (HARP).

In one embodiment, the lower dielectric layer 2911 may be formed using a plasma-enhanced chemical vapor deposition process. The filling performance of the plasma-enhanced chemical vapor deposition process may be substantially poor, which may facilitate the film layer to be formed on the top of the cavity 290, such that the top of the cavity 290 may be sealed.

Accordingly, the present disclosure also provides a semiconductor structure. Referring to FIG. 15, the semiconductor structure may include a substrate, a gate structure 261 over the substrate, and a sidewall spacer structure on a sidewall surface of the gate structure 261. The sidewall spacer structure may include a first sidewall spacer 221, a second sidewall spacer 241, and a cavity 290 located between the first sidewall spacer 221 and the second sidewall spacer 241. The first sidewall spacer 221 may be located on a sidewall surface of the gate structure 261. A top surface of the cavity 290 may be above a top surface of the gate structure 261, and a bottom surface of the cavity 290 may be coplanar with a bottom surface of the gate structure 261. The semiconductor structure may also include source and drain plugs 281 located over the substrate on both sides of the gate structure 261. The source and drain plug 281 may be located on the sidewall surface of the second sidewall spacer 241.

The disclosed embodiments may have following beneficial effects. In the disclosed semiconductor structure of the present disclosure, the sidewall spacer structure may be located on the sidewall surface of the gate structure. The sidewall spacer structure may include the first sidewall spacer, the second sidewall spacer, and the cavity located between the first sidewall spacer and the second sidewall spacer. Therefore, the gate structure may have desired performance. At the same time, because the cavity has an opening structure, air may fill the cavity. The dielectric constant of the cavity may be substantially small, which may facilitate to reduce the parasitic capacitance between the gate structure and any other device, thereby facilitating to improve the performance of the semiconductor structure.

In the disclosed fabrication method of the present disclosure, after replacing the dummy gate structure with the gate structure, the sacrificial sidewall spacer on the sidewall surface of the first sidewall spacer may be removed, to form the cavity between the first sidewall spacer and the second sidewall spacer. Because the first sidewall spacer is formed on the sidewall surface of the gate structure, the first sidewall spacer may protect the gate structure, and may prevent the sidewall of the gate structure from being damaged in subsequent processes, such that the gate structure may have desired performance. At the same time, the cavity may be formed between the first sidewall spacer and the second sidewall spacer, and the first sidewall spacer may be located on the sidewall surface of the gate structure. Because the cavity has an opening structure, air may fill the cavity. The dielectric constant of the cavity may be substantially small, which may facilitate to reduce the parasitic capacitance between the gate structure and any other device, thereby facilitating to improve the performance of the semiconductor structure.

In addition, the plug opening may expose the sidewall surface of the second sidewall spacer, and the source and drain plug located in the plug opening may be located on the sidewall surface of the second sidewall spacer. Therefore, the second sidewall spacer may protect the source and drain plug, and may prevent the sidewall of the source and drain plug from being damaged in subsequent processes, such that the source and drain plug may have desired performance.

Further, during the process of back-etching the first sidewall spacer material layer, the sacrificial material layer, and the second sidewall spacer material layer, the sacrificial structure may make the first sidewall spacer material layer and the second sidewall spacer material layer over the substrate be retained. Therefore, when forming the plug opening by etching, the first sidewall spacer material layer and the second sidewall spacer material layer over the substrate may be configured as a stop layer of the etching process, such that the formed plug opening may have desired morphology, and the damage on the source and drain doped region may be substantially small, thereby improving the performance of the formed semiconductor structure.

The above detailed descriptions only illustrate certain exemplary embodiments of the present disclosure, and are not intended to limit the scope of the present disclosure. Those skilled in the art can understand the specification as whole and technical features in the various embodiments can be combined into other embodiments understandable to those persons of ordinary skill in the art. Any equivalent or modification thereof, without departing from the spirit and principle of the present disclosure, falls within the true scope of the present disclosure.

What is claimed is:

1. A semiconductor structure, comprising:
   a substrate;
   a gate structure over the substrate;
   a sidewall spacer structure, located on a sidewall surface of the gate structure, wherein:
      the sidewall spacer structure comprises a first sidewall spacer, a second sidewall spacer, and a cavity located between the first sidewall spacer and the second sidewall spacer,
      the first sidewall spacer is located on the sidewall surface of the gate structure, and
      a top surface of the cavity is coplanar with a top surface of the gate structure, and a bottom surface of the cavity is higher than a bottom surface of the gate structure; and
   a source and drain plug, located over the substrate on each side of the gate structure, wherein the source and drain plug is located on a sidewall surface of the second sidewall spacer.

2. The semiconductor structure according to claim 1, wherein:
   the bottom surface of the cavity is in contact with a top surface of the first sidewall spacer.

3. The semiconductor structure according to claim 2, wherein:
   a bottom surface of the second sidewall spacer is in contact with the top surface of the first sidewall spacer, and is coplanar with the bottom surface of the cavity.

4. The semiconductor structure according to claim 1, further comprising:
   a lower dielectric layer on the top surface of the gate structure, a top surface of the first sidewall spacer, a top surface of the second sidewall spacer, and a portion of a sidewall surface of the source and drain plug, and sealing the top surface of the cavity; and
   an upper dielectric layer on a surface of the lower dielectric layer.

5. The semiconductor structure according to claim 4, wherein a top surface of the upper dielectric layer is higher than a top surface of the source and drain plug.

6. A fabrication method of a semiconductor structure, comprising:
   forming a dummy gate structure over a substrate;
   forming a sidewall spacer structure on a sidewall surface of the dummy gate structure, wherein the sidewall spacer structure comprises a first sidewall spacer, a second sidewall spacer, and a sacrificial sidewall spacer located between the first sidewall spacer and the second sidewall spacer, and the first sidewall spacer is located on the sidewall surface of the dummy gate structure;
   forming a first dielectric layer over the substrate, wherein the first dielectric layer is located on a sidewall surface of the sidewall spacer structure;
   after forming the sidewall spacer structure, removing the dummy gate structure to form a dummy gate opening in the first dielectric layer;
   forming a gate structure in the dummy gate opening;
   forming a plug opening in the first dielectric layer, and forming a source and drain plug in the plug opening, wherein the plug opening exposes a sidewall surface of the second sidewall spacer; and
   after forming the source and drain plug, removing the sacrificial sidewall spacer to form a cavity between the first sidewall spacer and the second sidewall spacer, a top surface of the cavity being coplanar with a top surface of the gate structure, and a bottom surface of the cavity being higher than a bottom surface of the gate structure.

7. The method according to claim 6, wherein forming the sidewall spacer structure comprises:
   forming a first sidewall spacer material layer on a top surface and the sidewall surface of the dummy gate structure and on a surface of the substrate;
   forming a sacrificial material layer on a sidewall surface of the first sidewall spacer material layer;
   forming a second sidewall spacer material layer on a surface of the sacrificial material layer and on an exposed surface of the first sidewall spacer material layer; and
   back-etching the first sidewall spacer material layer, the sacrificial material layer, and the second sidewall spacer material layer until a top surface of the dummy gate structure is exposed, to form the first sidewall spacer from the first sidewall spacer material layer, form the sacrificial sidewall spacer from the sacrificial material layer, and form the second sidewall spacer from the second sidewall spacer material layer.

8. The method according to claim 7, wherein forming the sacrificial material layer comprises:
   forming an initial sacrificial material film on a surface of the first sidewall spacer material layer; and
   back-etching the initial sacrificial material film until a top surface of the first sidewall spacer material layer is exposed, to form the sacrificial material layer.

9. The method according to claim 7, after forming the second sidewall spacer material layer, and before back-etching the first sidewall spacer material layer, the sacrificial material layer, and the second sidewall spacer material layer, further comprising:
   forming a sacrificial structure over the substrate, wherein:
      the sacrificial structure covers a partial surface of the second sidewall spacer material layer over the substrate and exposes another partial surface of the second sidewall spacer material layer over a top of the dummy gate structure, and
      during the process of back-etching the first sidewall spacer material layer, the sacrificial material layer, and the second sidewall spacer material layer, the second sidewall spacer material layer and the first sidewall spacer material layer over the top of the dummy gate structure are removed, and the first sidewall spacer material layer and the second sidewall spacer material layer over the substrate are retained.

10. The method according to claim 7, after forming the first sidewall spacer material layer, and before forming the sacrificial material layer, further comprising:
    forming a source and drain doped region in the substrate on each side of the dummy gate structure.

11. The method according to claim 10, wherein forming the source and drain doped region comprises:
    removing the substrate on each side of the dummy gate structure to form a source and drain opening in the substrate; and
    forming the source and drain doped region in the source and drain opening.

12. The method according to claim 10, wherein:
a top surface of the source and drain plug is above a top surface of the gate structure.

13. The method according to claim 12, after forming the gate structure and before removing the sacrificial sidewall spacer, further comprising:
forming a second dielectric layer on a surface of the first dielectric layer and on the top surface of the gate structure; and
forming the plug opening in the first dielectric layer and the second dielectric layer.

14. The method according to claim 6, wherein:
the first sidewall spacer is made of a material different from the sacrificial sidewall spacer; and
the second sidewall spacer is made of a material different from the sacrificial sidewall spacer.

15. The method according to claim 14, wherein:
the first sidewall spacer is made of a material comprising silicon oxide, silicon nitride, silicon oxy-nitride, or titanium dioxide;
the second sidewall spacer is made of a material comprising silicon oxide, silicon nitride, silicon oxy-nitride, or titanium dioxide; and
the sacrificial sidewall spacer is made of a material comprising silicon oxide, silicon nitride, silicon oxy-nitride, or titanium dioxide.

16. The method according to claim 6, after forming the cavity, further comprising:
forming a third dielectric layer over the gate structure, wherein the third dielectric layer seals a top of the cavity.

17. The method according to claim 16, wherein forming the third dielectric layer comprises:
forming a lower dielectric layer on a top surface of the gate structure, a top surface of the first sidewall spacer, a top surface of the second sidewall spacer, and a top surface and a portion of a sidewall surface of the source and drain plug, wherein the lower dielectric layer seals the top of the cavity; and
forming an upper dielectric layer on a surface of the lower dielectric layer, wherein a top surface of the upper dielectric layer is above a top surface of the source and drain plug.

18. The method according to claim 6, wherein:
along a direction perpendicular to a sidewall of the cavity, a size of the cavity is in a range of approximately 5 nm-10 nm.

19. The method according to claim 6, wherein forming the gate structure in the dummy gate opening comprises:
forming an interface layer on a bottom surface of the dummy gate opening;
forming a high-K dielectric material film over a bottom and on a sidewall surface of the dummy gate opening, and on a surface of the first dielectric layer, wherein the high-K dielectric material film is located on a surface of the interface layer;
forming a work function material film on a surface of the high-K dielectric material film;
forming a gate material film on a surface of the work function material film; and
planarizing the high-K dielectric material film, the work function material film, and the gate material film until the surface of the first dielectric layer is exposed, to form a high-K dielectric layer from the high-K dielectric material film, form a work function layer from the work function material film, and form a gate layer from the gate material film.

20. The method according to claim 6, wherein:
the substrate comprises a base, and a fin and an isolation layer over the base, wherein the isolation layer covers a portion of a sidewall surface of the fin; and
the dummy gate structure is located on a surface of the isolation layer, and is across a length portion of the fin.

\* \* \* \* \*